United States Patent Office 3,501,296
Patented Mar. 17, 1970

3,501,296

PRODUCTION OF LIGHT-SENSITIVE COATINGS FOR USE IN THE MANUFACTURE OF COPYING MATERIALS SUCH AS PRINTING PLATES

Gerard Albert Delzenne, 's-Gravenwezel, Belgium, assignor to Gevaert-Agfa N.V., Mortsel, Belgium, a Belgian company
No Drawing. Filed Mar. 4, 1968, Ser. No. 709,932
Claims priority, application Great Britain, Mar. 23, 1967, 13,823/67
Int. Cl. G03c *1/68, 1/52;* G03f *7/08*
U.S. Cl. 96—33 10 Claims

ABSTRACT OF THE DISCLOSURE

A light-sensitive, alkali-soluble composition comprising a mixture of an alkalai-soluble polymer and a 3-diazo-oxindole or a 1-diazo-benz (e)-indoline-2-one which finds use as a copy material in the preparation of negative working printing plates when the composition is in a layer on a support by imagewise actinic light exposure and subsequent solvent development.

This invention relates to light-sensitive compounds, and to the production of light-sensitive coatings for use in the manufacture of copying materials.

In the published Dutch patent application 6,701,699, a copying material has been described for use in the photochemical preparation of printing plates. This copying material is composed of a support having thereon a light-sensitive coating comprising naphthoquinone-1,2-diazide-(2)-4-sulphofluoride or naphthoquinone-1,2-diazide(2)-5-sulphofluoride. In general the light-sensitive coating also comprises a polymeric binder, especially when it is intended to etch the images obtained on metallic supports, or when the images are directly to be used as printing plates. For such uses the said polymer is preferably an alkali-soluble polymer. When the light-sensitive alkali-insoluble layer is exposed to actinic light through a transparent master pattern, the light induces the photolytic transformation of the quinone diazide groups probably into alkali-soluble indene-carboxylic acid derivatives, in such a way that the areas of the light-sensitive layer which have been exposed to actinic light become soluble in an alkaline aqueous medium and can be washed away, leaving the unexposed areas of the light-sensitive layer to form a positive image of the original master pattern. When inked, these images can directly be used for planographic and offset printing. They may also be subjected to an etching process, which makes the copying material suitable for intaglio or relief printing.

Very surprisingly it has now been found that when exposing to actinic light a composition comprising other diazoketones of well defined structure in admixture with alkali-soluble polymers, these compositions are not solubilized at all, but on the contrary that in the exposed areas these diazoketones or their photodecomposition products act as modifying agents for the alkali-soluble polymers and procure alkali-insolubility to the mixture.

According to the invention a light-sensitive, alkali-soluble composition is provided which on exposure to light is capable of becoming insoluble in alkaline medium, and which comprises a mixture o fan alkali-soluble polymer and of a diazo-oxindole of the formula:

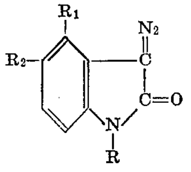

wherein:

R represents a hydrogen atom, an alkyl group, an aryl group, an alkaryl group, an aralkyl group, or an acyl group, and wherein each of $R_1$ and $R_2$ represents a hydrogen atom or together represent the necessary atoms to form a fused on benzene ring.

In the above formula, the group "=N" is intended to cover the alternative forms of the diazide group namely $$=\overset{+}{N}=\overset{-}{N} \quad \text{and} \quad -\overset{+}{N}\equiv\overset{-}{N}$$

Examples of suitable diazo-oxindoles are:

3-diazo-oxindole
1-methyl-3-diazo-oxindole
1-(p-tolylsulphonyl)-3-diazo-oxindole
1-benzoyl-3-diazo-oxindole
1-cinnamoyl-3-diazooxindole
1-(1-naphthoyl)-3-diazo-oxindole
1-diazo-benz[e]-indoline-2-one
1-diazo-3-acetyl-benz[e]-indoline-2-one.

The light-sensitive, alkali-soluble composition is formed from a mixture of a diazo-oxindole and of an alkali-soluble polymer, the latter constituting the polymeric binder for the light-sensitive diazo-oxindole. As alkali-soluble polymers may be used copolymers of unsaturated carboxylic acids, such as acrylic acid, methacrylic acid, crotonic acid, maleic acid, fumaric acid, itaconic acid and citraconic acid. If the copolymer comprises an unsaturated dicarboxylic acid, the half-esters and half-amides thereof may be used too. These unsaturated carboxylic acids are copolymerized with ethylenically unsaturated compounds which are substantially insoluble in an alkaline medium and which are present in the copolymer in such a ratio that the copolymer itself remains soluble in alkaline medium. Ethylenically unsaturated compounds that may be used in this respect include styrene and its derivatives, vinyl chloride, vinylidene chloride, vinyl esters such as vinyl acetate, acrylic acid esters, methacrylic acid esters, acrylonitrile and methacrylonitrile.

Preferred alkali-soluble polymers, however, are the so-called novolaks. According to British Standard 1755–1951 these are "soluble, fusible, synthetic resins produced from a phenol and an aldehyde, having no reactive groups (i.e. methylol groups) in the molecule and therefore incapable of condensing with other novolak molecules on heating without the addition of hardening agents."

The amount of alkali-soluble resin added to the light-sensitive composition may vary within wide limits, but in general at least one part by weight of alkali-soluble resin is present for every two parts by weight of diazo-oxindole.

The light-sensitive, alkali-soluble mixture of diazo-oxindole and of alkali-soluble polymer may also comprise minor amounts of additives which increase the light-sensitivity of the diazo-oxindoles.

Further, the light-sensitive composition may also comprise stabilizers, plasticizers, extenders, dyes and the like. The term "light-sensitive composition" in the accompanying description is to be understood to mean a composition comprising the light-sensitive diazo-oxindoles and the alkali-soluble polymers and which may include also other additives.

The mixture of a diazo-oxindole according to the invention and an alkali-soluble polymer is light-sensitive. When such a mixture is applied as a coating to a suitable support, a light-sensitive coating is obtained which can be exposed to light as a whole. Selected areas of the same light-sensitive coating can also be exposed to light, whereby in the exposed areas the mixture becomes insoluble. In the non-exposed areas, however, the mixture remains alkali-soluble and can be washed away with an alkaline solvent. Such a differential exposure to light followed by dissolving away the unexposed areas constitutes a means for photochemically forming a copying material, more especially for forming printing plates and etching resists.

In order to prepare a copying material in accordance with the invention, a support is coated with a solution in an organic solvent or in a mixture of organic solvents of the diazo-oxindole and of the alkali-soluble polymer. Metal supports or supports coated with metals such as for example zinc, and especially aluminium, are excellently suited as base materials for a printing plate. It is not strictly necessary to subject the metal supports to be used to any preliminary chemical treatment in order to render their surfaces suitable for accepting the light-sensitive layer. A simple mechanical roughening of the metallic surface proves to be quite sufficient for the application of the light-sensitive layer, which firmly attaches itself to the metallic base in the form of a thin uniform film. For the production of planographic printing plates there can also be used e.g. plates of stone or glass and also especially treated sheets of paper or plastic foils.

The base or support is coated by whirlcoating, brushing or spraying with a solution of the light-sensitive composition in a suitable solvent and may be coated continuously on known coating machines, whereupon the solvent or solvent mixture is eliminated by known means such as evaporation, thus leaving a more or less thin coating of the light-sensitive composition upon the base or support. The thickness of the light-sensitive layer obtained may be from about 0.5 to 20$\mu$ and is preferably between 1 and 5$\mu$. The light-sensitive coating is then ready for exposure to actinic light rays. The light source should furnish an effective amount of ultraviolet radiation. Suitable sources of light include carbon arcs, xenon lamps, mercury vapour lamps, fluorescent lamps, argon glow lamps, photographic flood lamps and tungsten lamps.

The light-sensitive layer is exposed to actinic light through a contacted transparent master pattern consisting solely of opaque and transparent areas e.g. the so-called line or half-tone positive or negative wherein the opaque areas are of the same optical density. However, it is also possible to expose the light-sensitive layer to a projected image.

It is assumed that in the exposed areas the light induces the photolytic transformation of the diazo-oxindoles. Their decomposition products modify the alkali-soluble ploymeric binding agent whereby the latter loses its alkali-solubility.

The development or removal of the coating in the unexposed areas can be effected by means of water or of an aqueous composition, preferably, however, by means of an alkaline aqueous solution rapidly dissolving the unmodified diazo-oxindole together with the alkali-soluble polymer. An alkaline developer which may conveniently be used is an aqueous solution of a phosphate of an alkaline metal such as sodium phosphate. In the exposed areas of the printing plate the presence of the decomposition products of the diazo-oxindole renders the alkali-soluble polymer insoluble in alkaline medium. Accordingly, the exposed areas of the layer remain to form a negative image of the master pattern. These negative images can be used as printing plates, such as for planographic and offset printing. They may also be subjected to an etching process which make them suitable for intaglio or relief printing.

After removal of the unexposed areas of the light-sensitive layer by the developing solution, the ink-repellency of the unshielded areas of the base material can be improved by an after-treatment with a lithographic preparation for hydrophilizing or enhancing the hydrophility of said areas. Compounds and compositions suited for that purposes are described, e.g., in United Kingdom patent specification 946,538.

The ink-receptivity of the hydrophobic exposed areas can be improved by treating the developing printing plate with a lacquer which adheres to the hydrophobic areas and forms an oleophilic deposit thereon. Suitable lacquers and the method of applying them are described in United Kingdom patent specification 968,706 and Belgian patent specification 631,790.

In order to prepare a printing form for gravure printing, an exposure and etching technique is used whereby in the base material according to a screen pattern cells can be formed for receiving the printing ink.

Base materials suited for etching are well known. More particularly are mentioned base materials, which substantially consist of zinc, copper, steel or an etchable magnesium alloy.

In order to prepare a planographic printing plate, a base material is chosen suited for lithographic printing, preferably a zinc sheet.

A special advantage of the use of the diazo-oxindoles according to the invention is the easy way in which these products can be synthetized, starting from inexpensive raw materials. A further advantage of the present light-sensitive coatings is the great thermal stability of the diazo-oxindoles of the invention; so that photographic materials containing them can be prepared, a considerable time before use.

Another advantage is the good light-sensitivity for practical wave-length ranges.

The following examples illustrate the invention.

EXAMPLE 1

In a three-necked flask provided with a stirrer and a reflux condenser were dissolved 9 g. of N-methyl-3-p-tolyl-sulphonyl-hydrazono-oxindole in 300 ccs. of a 0.1 N aqueous sodium hydroxide solution and 720 ccs. of methylene chloride were added, whereafter the mixture was stirred for 2 hours at room temperature and 5 hours at reflux temperature. The reaction mixture was cooled and the methylene chloride layer separated in a funnel, dried with calcium chloride and evaporated to dryness. The residue was N-methyl-3-diazo-oxindole. A solution of 50 mg. of the latter and 50 mg. of novolak in 3 ccs. of acetone was applied to an aluminuim support, in such a way that after evaporation of the acetone a layer with a thickness of about 3$\mu$ was left. This layer was exposed through a line transparency with an 80 watt mercury vapour lamp placed at a distance of 15 cm. After exposure for 2.30 minutes, the exposed areas of the layer had become insoluble in a 5% aqueous sodium phosphate solution, whereas the non-exposed areas remained soluble therein. Hereby a negative image of the line transparency was formed. The unshielded areas of the aluminium support which were bared during development by dissolving away the unexposed areas of the light-sensitive layer were rendered more hydrophilic by means of a 1% phosphoric acid solution. Hereafter the plate was inked and used as a printing plate.

In the above-described light-sensitive layer, the novolak can be replaced by another alkali-soluble polymer such as a copolymer of maleic anhydride and styrene or ethylene.

EXAMPLE 2

In a three-necked flask provided with a stirrer and a reflux condenser were dissolved 31.5 g. of 3-p-tolylsulphonyl-hydrazono-oxindole and 4.4 g. of sodium hydroxide in 500 ccs. of water. 500 ccs. of methylene chloride were added, whereafter the mixture was stirred for 2 hours at room temperature and 5 hours at reflux temperature. The reaction mixture was cooled and the methylene chloride layer separated in a funnel, dried with calcium chloride and evaporated to dryness. The residue is 3-dioza-oxindole. A solution of 50 mg. of the latter and 50 mg. of novolak in 3 ccs. of acetone is applied to a zinc support in such a way that after evaporation a layer with a thickness of 3μ was left. This layer was exposed through a line transparency with an 80 watt mercury vapour lamp placed at a distance of 15 cm. After exposure for 6 minutes, the exposed areas of the layer had become insoluble in a 3% aqueous sodium phosphate solution, whereas the non-exposed areas remained soluble therein. Hereby a negative relief of the line transparency was formed which was rubber with an aqueous fixing solution containing 4% of potassium hexacyano-ferrate(III), 20% of gum arabic and 1% of phosphoric acid.

A hydrophilic lacquer, e.g. the class described in United Kingdom specification 968,706 and Belgian specification 631,790 was applied to the remaining parts of the light-sensitive layer whereby these parts were reinforced. In this way a planographic printing plate was obtained having a great wear-resistance of the image, which fact enables the printing of a high number of copies.

The unshielded areas of the zinc support which were bared during development by dissolving away the unexposed areas of the light-sensitive layer may also be subjected to an etching process whereby the remaining parts of the light-sensitive layer serve as the etching resist. As etching solution was used, a 10% aqueous solution of nitric acid, a plate suitable for letterpress printing was thereby obtained.

EXAMPLE 3

In a three-necked flask provided with a stirrer and a dropping funnel were dissolved 1.5 g. of 3-diazo-oxindole, prepared as in Example 2, and 1.9 g. of p-toluenesulphochloride in 25 ccs. of acetone. The obtained solution was cooled in ice-water, a solution of 0.55 g. of sodium carbonate in 5 ccs. of water was dropwise added and the mixture was stirred for 1 hour at room-temperature. The N-p-tolylsulphonyl-3-diazo-oxindole was precipitated by pouring out into water. The precipitated product was sucked off, washed with water and dried under vacuum. A solution of 50 mg. of the obtained N-p-tolylsulphonyl-3-diazo-oxindole and 50 mg. of novolak in 3 ccs. of acetone was applied to an aluminium support in such a way that after evaporation a layer with a thickness of 3μ was left. This layer was exposed through a screen transparency with an 80 watt mercury vapour lamp placed at a distance of 15 cm. Development occurred with a 5% aqueous sodium phosphate solution to which 5% methyl Cellosolve and 2.5% sodium chloride were added. After exposure for 5 minutes, a sharp relief image was obtained.

EXAMPLE 4

Into a flask provided with a stirrer, a cooler with calcium chloride tube and a dropping funnel were poured 10 ccs. of pyridine and 1.2 ccs. of benzoyl chloride. Whilst stirring, the solution was cooled down to −5° C. and 1.5 g. of 3-diazo-oxindole was portion-wise added. Thereafter the solution was stirred for half an hour at −5° C. and 1 hour at 0 to 5° C.

The N-benzoyl-3-diazo-oxindole was precipitated by pouring out into water to which 20 ccs. of strong hydrogen chloride were added. The precipitate was sucked off, washed with water and dried under vacuum.

A solution of 50 mg. of the formed N-benzoyl-3-diazo-oxindole and 50 mg. of novolak in 3 ccs. of acetone was applied to an aluminium support in such a way that after evaporation a layer with a thickness of 3μ was left. This layer was exposed and developed as in Example 1. After exposure for 5 minutes, a sharp relief image was obtained.

EXAMPLE 5

In a three-necked flask provided with a stirrer and a reflux condenser were dissolved 13 g. of 1(p-tolylsulphonylhydrazono)-benz[e]-indoline-2-one in 150 ccs. of dimethylformamide and a solution of 1.5 g. of sodium hydroxide in 80 ccs. of water was added. The mixture was stirred for 5 hours at 45–50° C. After 5 minutes, the product starts depositing. The deposited 1-diazo-benz[e]-indoline-2-one was cooled, sucked off, washed with water and dried under vacuum. A solution of 25 mg. of this 1-diazo-benz[e]-indoline-2-one and 50 mg. of novolak in a mixture of 2 ccs. acetone and 1 cc. of methyl Cellosolve was applied to an aluminium support in such a way that a layer with a thickness of 3μ was left. Exposure occurred as in Example 1, but development was carried out in a 5% aqueous solution of sodium phosphate to which 15% sodium chloride was added. After exposure for 5 minutes, a sharp relief image was obtained.

EXAMPLE 6

In a three-necked flask, provided with a stirrer and a cooler were dissolved 2 g. of 1(p-tolyl-sulphonyl-hydrazono) - 3 - acetyl - benz[e] - indoline - 2 - one in 200 ccs. of methylene chloride, and a solution of 0.22 g. of sodium hydroxide in 50 ccs. of water was added. The mixture was stirred and refluxed for 5 hours. A product precipitated which later on dissolves again. The methylene chloride layer was separated in a funnel, dried with calcium chloride and evaporated to dryness. The formed product was 1-diazo-3-acetyl-benz[e]-indoline-2-one.

A solution of this 1-diazo-3-acetyl-benz[e]-indoline-2-one and novolak formed, as in Example 5, was applied to an aluminium support in such a way that a layer with a thickness of approximately 3μ was left. Exposure occurred as in Example 5. After exposure for 7 minutes a sharp relief image was obtained.

EXAMPLE 7

The process of Example 4 was repeated, 1.2 ccs. of benzoylchloride, however, were replaced by 1.8 ccs. of naphthoyl chloride, so that N-(1-naphthoyl)-3-diazooxindole was formed. As in Example 4, this diazo-oxindole, together with novolak, was applied as a light-sensitive layer to an aluminium support and exposed. Development occurred with a 5% aqueous sodium phosphate solution to which 5% methyl Cellosolve was added. After exposure for 5 minutes a sharp relief image was obtained.

EXAMPLE 8

The process of Example 4 was repeated, 1.2 ccs. of benzoyl chloride, however, was replaced by 1.6 g. of cinnamoyl chloride and at the end of the reaction, N-cinnamoyl-3-diazo-oxindole was obtained. An aluminium support was coated and exposure was carried out such as in Example 4. Development of the layer, however, occurred with a 5% aqueous solution of sodium phosphate to which 5% methyl Cellosolve was added. After exposure for 5 minutes a sharp relief image was obtained.

I claim:

1. Light-sensitive, alkali-soluble composition capable on exposure to actinic light of becoming insoluble in alkaline medium, comprising a mixture of an alkali-soluble polymer and a diazo-oxindole of the formula:

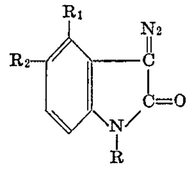

wherein:

R represents hydrogen, an alkyl group, an aryl group, an alkaryl group, an aralkyl group, or an acyl group, and wherein each of $R_1$ and $R_2$ is hydrogen, or together represent the necessary atoms to form a fused benzene ring.

2. Light-sensitive, alkali-soluble composition according to claim 1, comprising at least one part by weight of alkali-soluble polymer for every two parts by weight of diazo-oxindole.

3. Light-sensitive, alkali-soluble composition according to claim 1, wherein the alkali-soluble polymer is a novolak resin.

4. Light-sensitive, alkali-soluble composition according to claim 1, wherein the diazo-oxindole is 3-diazo-oxindole.

5. Light-sensitive, alkali-soluble composition according to claim 1, wherein the diazo-oxindole is N-methyl-3-diazo-oxindole.

6. Copying material for use in the photochemical preparation of printing plates, which comprises a support having thereon a layer of a light-sensitive, alkali-soluble composition capable on exposure to actinic light of becoming insoluble in alkaline medium and comprising a mixture of an alkali-soluble polymer and a diazo-oxindole of the formula:

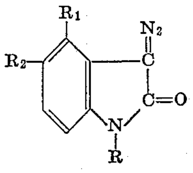

wherein:

R represents hydrogen, an alkyl group, an aryl group, an alkaryl group, an aralkyl group, or an acyl group, and wherein each of $R_1$ and $R_2$ is hydrogen, or together represent the necessary atoms to form a fused benzene ring.

7. A process for the photochemical preparation of a printing plate, which comprises exposing imagewise to actinic light under a master pattern, a copying material, which comprises a support having thereon a layer of a light-sensitive, alkali-soluble composition capable on exposure to actinic light of becoming insoluble in alkaline medium and comprising a mixture of an alkali-soluble polymer and of a diazo-oxindole of the formula:

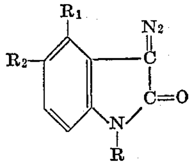

wherein:

R represents hydrogen, an alkyl group, an aryl group, an alkaryl group, an aralkyl group, or an acyl group, and wherein each of $R_1$ and $R_2$ is hydrogen, or together represent the necessary atoms to form a fused benzene ring, and developing the resulting negative image of the master pattern by dissolving the unexposed portions of the coating in an aqueous alkaline liquid.

8. A process as outlined in claim 7, wherein the aqueous alkaline liquid is an aqueous solution of sodium phosphate.

9. A process as outlined in claim 7, wherein the aqueous alkaline liquid is an aqueous solution of sodium phosphate and sodium chloride.

10. A process for the photochemical preparation of a printing plate, which comprises exposing imagewise to actinic light under a master pattern, a copying material, which comprises a support having thereon a layer of a light-sensitive, alkali-soluble composition capable on exposure to actinic light of becoming insoluble in alkaline medium and comprising a mixture of an alkali-soluble polymer and of a diazo-oxindole of the formula:

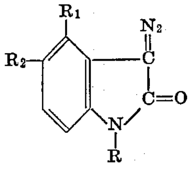

wherein:

R represents hydrogen, an alkyl group, an aryl group, an alkaryl group, an aralkyl group, or an acyl group, and wherein each of $R_1$ and $R_2$ is hydrogen, or together represent the necessary atoms to form a fused benzene ring, developing the resulting negative image of the master pattern by dissolving the unexposed portions of the coating in an aqueous alkaline liquid and etching the developed printing plate in order to produce a negative relief printing plate.

References Cited

UNITED STATES PATENTS

| | | | |
|---|---|---|---|
| 2,971,842 | 2/1961 | Moore et al. | 96—33 |
| 2,997,467 | 8/1961 | Cox et al. | 96—33 XR |

NORMAN G. TORCHIN, Primary Examiner

C. BOWERS, Assistant Examiner

U.S. Cl. X.R.

96—35.1, 36.3, 75, 91, 115